United States Patent
Eickelmann et al.

(10) Patent No.: US 7,897,434 B2
(45) Date of Patent: *Mar. 1, 2011

(54) METHODS OF FABRICATING SOLAR CELL CHIPS

(75) Inventors: Hans-Juergen Eickelmann, Nieder-Hilbersheim (DE); Michael Haag, Rodenbach (DE); Harold J. Hovel, Katonah, NY (US); Rainer Klaus Krause, Main-Kostheim (DE); Markus Schmidt, Seibersbach (DE); Xiaoyan Shao, Yorktown Heights, NY (US); Steven Erik Steen, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

This patent is subject to a terminal disclaimer.

(21) Appl. No.: 12/189,911

(22) Filed: Aug. 12, 2008

(65) Prior Publication Data

US 2010/0037939 A1 Feb. 18, 2010

(51) Int. Cl.
*H01L 21/00* (2006.01)
(52) U.S. Cl. .................. 438/110; 438/113; 438/636; 257/758
(58) Field of Classification Search .............. None
See application file for complete search history.

(56) References Cited

U.S. PATENT DOCUMENTS

| | | | | |
|---|---|---|---|---|
| 5,928,438 | A * | 7/1999 | Salami et al. | 136/255 |
| 6,130,465 | A * | 10/2000 | Cole | 257/431 |
| 7,576,369 | B2 * | 8/2009 | Bui et al. | 257/127 |
| 7,579,666 | B2 * | 8/2009 | Bui et al. | 257/443 |
| 7,655,999 | B2 * | 2/2010 | Bui et al. | 257/447 |
| 2007/0227589 | A1 * | 10/2007 | Posthuma et al. | 136/261 |
| 2008/0014661 | A1 | 1/2008 | Haag et al. | |
| 2008/0092944 | A1 * | 4/2008 | Rubin | 136/252 |
| 2008/0290368 | A1 * | 11/2008 | Rubin | 257/184 |
| 2010/0037933 | A1 * | 2/2010 | Hovel et al. | 136/246 |
| 2010/0037936 | A1 * | 2/2010 | Becker et al. | 136/248 |

* cited by examiner

*Primary Examiner*—Jarrett J Stark
*Assistant Examiner*—Nicholas Tobergte
(74) *Attorney, Agent, or Firm*—Lieberman & Brandsdorfer, LLC (57) ABSTRACT

A method of fabricating solar cell chips. The method includes creating an integrated circuit chip process route for fabricating integrated circuit chips using integrated circuit wafers in an integrated circuit fabrication facility; creating a solar cell process route for fabricating solar cells using solar cell wafers in the integrated circuit fabrication facility; releasing integrated circuit chip wafers and solar cell wafers into tool queues of tools of the an integrated circuit fabrication facility; and processing the solar cell wafers on at least some tools of the integrated circuit fabrication facility used to process the integrated circuit wafers. Also the process used to fabricate the solar cell chips.

11 Claims, 6 Drawing Sheets

METHODS OF FABRICATING SOLAR CELL CHIPS

FIELD OF THE INVENTION

The present invention relates to the field of solar cells; more specifically, it relates to a method of fabricating a solar cell.

BACKGROUND OF THE INVENTION

Solar cells or solar concentrators are semiconductor devices capable of generating electricity using the photovoltaic effect. The relatively high cost of fabricating solar cells has seriously limited the widespread use of solar cells. Accordingly, there exists a need in the art to mitigate the deficiencies and limitations described hereinabove.

SUMMARY OF THE INVENTION

A first aspect of the present invention is a method, comprising: (a) forming a P-doped layer and an N-doped layer in a silicon substrate, the P-doped layer adjacent to a top surface of the substrate and the N-doped layer adjacent to a bottom surface of the substrate; (b) forming a dielectric top passivation layer on the top surface of the substrate and a dielectric bottom passivation layer on the top surface of the substrate; (c) forming an antireflective coating on the top passivation layer; (d) photolithographically forming a first set of openings through the antireflective coating and through the top passivation layer to the P-doped layer and photolithographically forming a second set of openings through the bottom passivation layer to the N-doped layer; (e) forming first metal silicide contacts to the P-doped layer and second metal silicide contacts to the N-doped layer in the first and second openings respectively; (f) forming metal contact frames on the first metal silicide contacts and metal bus bars on the second metal silicide contacts; and (g) singulating the substrate into a plurality of solar cell chips, each solar cell chip including a contact frame and a bus bar.

A second aspect of the present invention is a method, comprising: creating an integrated circuit chip process route for fabricating integrated circuit chips using integrated circuit wafers in an integrated circuit fabrication facility; creating a solar cell process route for fabricating solar cells using solar cell wafers in the integrated circuit fabrication facility; releasing integrated circuit chip wafers and solar cell wafers into tool queues of tools of the an integrated circuit fabrication facility; and processing the solar cell wafers on at least some tools of the integrated circuit fabrication facility used to process the integrated circuit wafers.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

FIGS. 1A through 1J are cross-sectional drawings illustrating fabrication of a solar cell according to embodiments of the present invention. Generally, integrated circuit chips are fabricated using semiconductor substrates that are thin disc shaped substrates called wafers. The terms substrate and wafer may be used interchangeably herein. An integrated circuit chip is defined as a solid-state device including transistors (e.g., field effect and/or bipolar transistors) forming logic and/or memory circuits. The logic and/or memory circuits may be analog or digital.

Figure 1A:
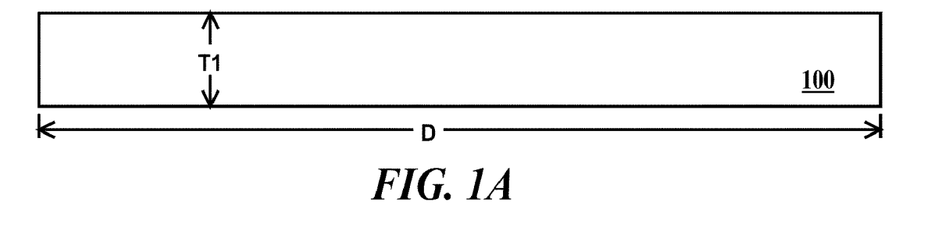
FIGS. 1A through 1J are cross-sectional drawings illustrating fabrication of a solar cell according to embodiments of the present invention.
Figure 1B:
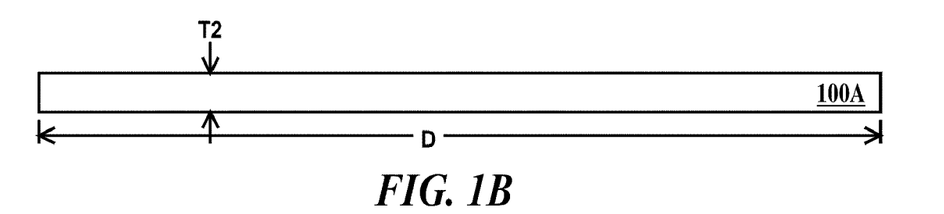

In FIG. 1A, a bulk single-crystal silicon substrate 100 has a thickness T1 and a diameter D. In one example, D is about 300 mm and T1 is about 700 microns. In FIG. 1B, substrate 100 of FIG. 1A has optionally been thinned to a thickness T2. In one example T2 is about 300 microns. In one example T2 is less than 700 microns. In one example, T2 is less than about 700 microns and not less than about 300 microns. In one example, substrate 100A is a thinned virgin wafer (i.e., a wafer having had no integrated circuit chip processing) which may be thinned by abrasive grinding (a mechanical process), by chemical-mechanical-polishing (CMP) (which is both a chemical and a mechanical process) or combinations thereof. In one example substrate 1B is formed from a scrap wafer on which conventional integrated circuit chips had been fully or partially fabricated but which either were misprocessed or failed a testing procedure. Thinning may be accomplished by etching (which is a chemical process), by abrasive grinding, by CMP or combinations thereof of either the top, the bottom or both the top and the bottom surfaces of the substrate. In one example substrate 100 (or 100A) are intrinsic or lightly doped P type (e.g., to a resistivity of about 0.5 ohm-cm to about 2.5 ohm-cm). For exemplary purposes, FIGS. 1C through 1J will be illustrated using substrate 100 of FIG. 1A, but it should be understood that the processes described in FIGS. 1C through 1J may be practices on thinned substrate 100A. A method of reclaiming scrap integrated circuit wafers is described in United States Patent Publication US 2008/0014661 by Haag et al. filed on Jul. 11, 2007, which is hereby incorporated by reference.

Figure 1C:
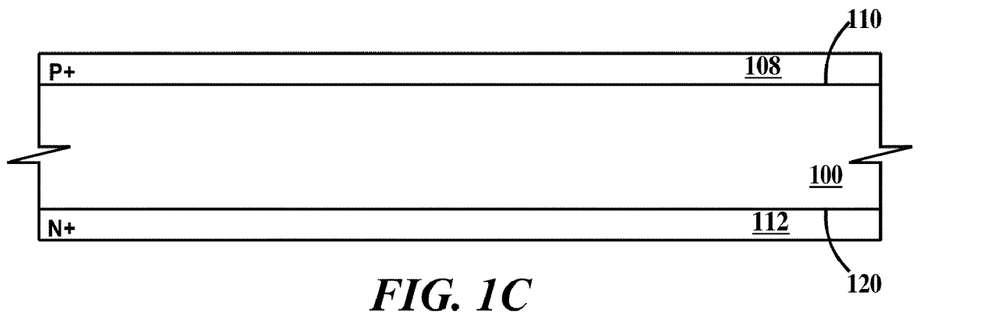
Figure 1D:
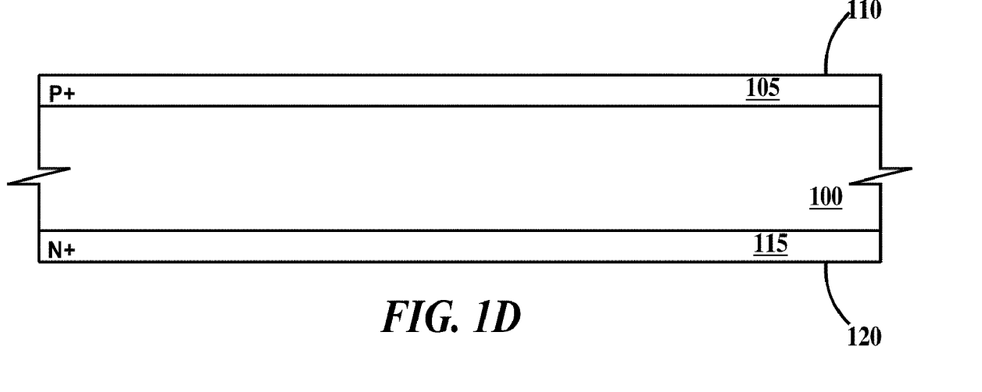

In FIG. 1C, a P-doped glass layer 108 is applied to a top surface 110 of substrate 100 and a N-doped glass layer 112 applied to a bottom surface 120 of substrate 100. In one example, layers 108 and 112 are applied by spin application of a doped glass suspension followed by a bake to drive out the suspension liquid. In one example, layers 108 and 110 are formed by sputter deposition of boro-silicate and phospho-silicate glasses respectively. After a thermal anneal (e.g., of about 500° C. or higher) the dopants from layers 108 and 112 have diffused into substrate 100 to form a P-doped layer 105 in substrate 100 proximate to top surface 110 and an N-doped layer 115 in substrate 100 proximate to bottom surface 120 as illustrated in FIG. 1D and layers 108 and 112 removed (e.g., by wet etching) resulting in the structure illustrated in FIG. 1D. Alternatively, direct gaseous diffusion may be used to form P-doped layer 105 and N-doped layer 115 by introducing a dopant gas into a furnace at temperatures of about 900° C. or greater.

Alternatively, the process described in FIG. 1C may be eliminated and replaced by a P-type ion implantation (e.g., boron) into top surface 105 and an N-type ion implantation (e.g., phosphorus or arsenic or both) into bottom surface 120 followed by an activation anneal (e.g., of about 800° C. or higher) to form P doped layer 105 and N-doped layer 115 respectively. The ion-implantation process is highly compatible with conventional integrated circuit chip fabrication.

Figure 1E:
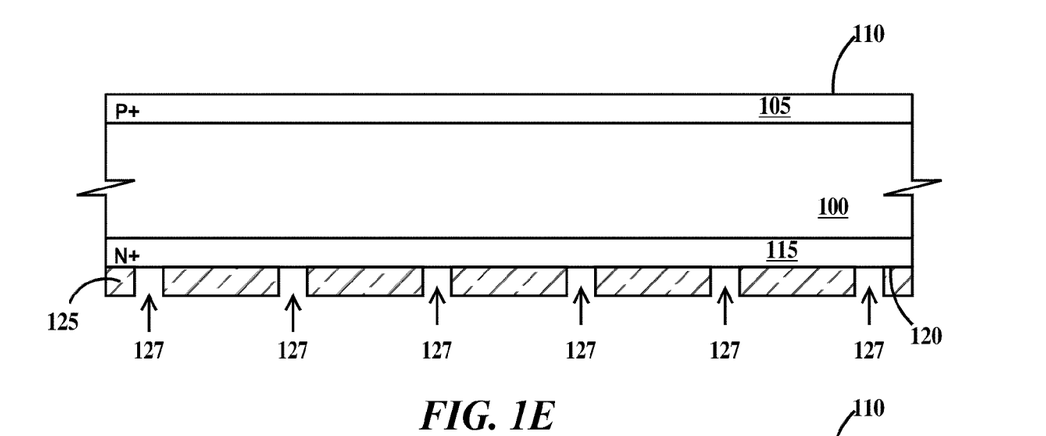
Figure 1F:
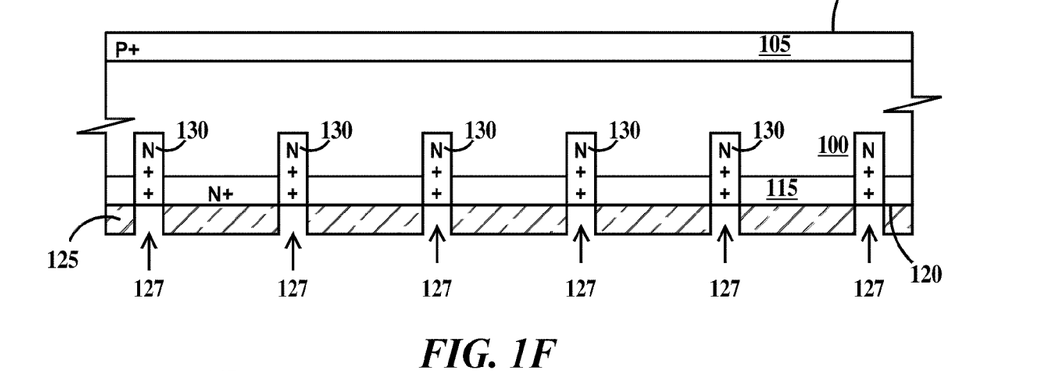

The processes illustrate in FIGS. 1E and 1F are optional. In FIG. 1E, a patterned masking layer 125 having openings 127 is formed on bottom surface 120 of substrate 100. In FIG. 1E, N-doped emitters 130 are formed through N-doped layer 115 into substrate 100 where substrate 100 is not protected by masking layer 125. The N-type dopant concentration of emitters 130 is higher than the N-type dopant concentration of N-doped layer 115.

In a first method, masking layer 125 is a dielectric layer and openings 127 are formed photolithographically. A photolithographic process is one in which a photoresist layer is applied to a surface, the photoresist layer exposed to actinic radiation through a patterned photomask and the exposed photoresist layer developed to form a patterned photoresist layer. After etching openings 127, the photoresist layer is removed and an N-doped glass layer (e.g., phospho-silicate glass) applied (either spun on or sputtered on as described supra for layer 112 of FIG. 1C). After a thermal anneal (e.g., of about 500° C. or higher) the dopant of the glass layer diffuse into substrate 100 forming emitters 130. Masking layer 125 is then removed.

In a second method, masking layer 125 is itself a patterned photoresist layer and an N-type ion implantation (e.g., phosphorus or arsenic or both) into bottom surface 120 followed by an activation anneal (e.g., of about 800° C. or higher) to form emitters 130. The ion-implantation process is highly compatible with conventional integrated circuit chip fabrication. Masking layer 125 is then removed.

Figure 1G:
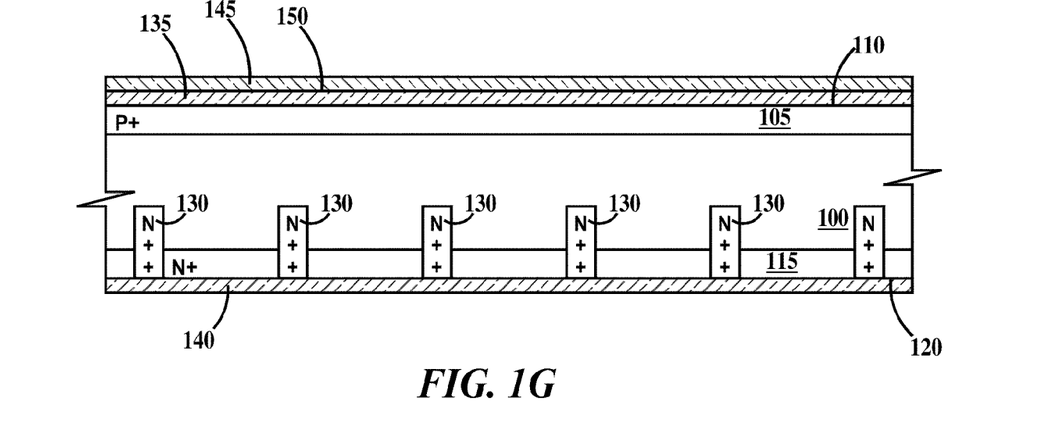

For exemplary purposes, FIGS. 1G through 1J will be illustrated with optional emitters 130. In FIG. 1G, an upper passivation layer 135 is formed on top surface 110 and a lower passivation layer 140 is formed on bottom surface 120 of substrate 100. In one example, upper and lower passivation layers comprise silicon dioxide. An antireflective coating 145 is formed on a top surface 150 of upper passivation layer 135.

Figure 1H:
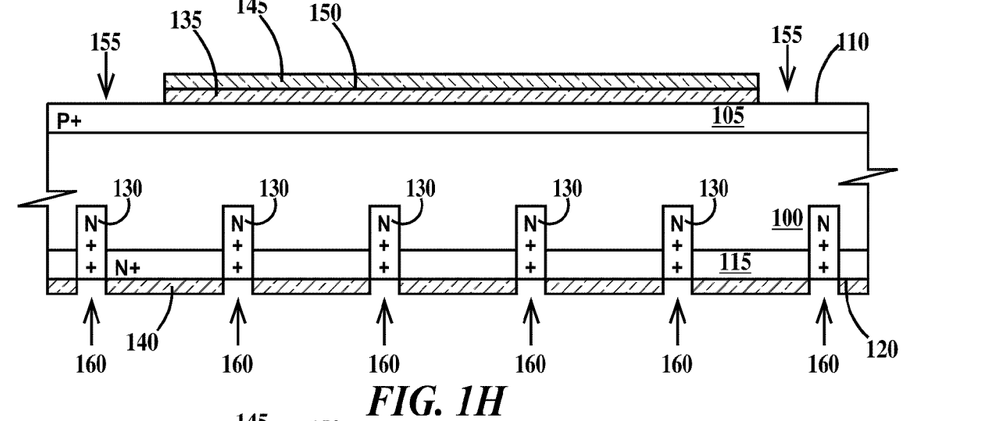

In FIG. 1H, top contact openings 155 are formed through upper passivation layer 135 and antireflective coating 145 and bottom contact openings 160 are formed through bottom passivation layer 140. Regions of P-doped layer 105 are exposed in openings 155 and emitters 130 (or regions of N-doped layer 115 if optional emitters 130 were not formed) are exposed in openings 160. Openings 155 and 160 may be photolithographically defined and etched prior to removing the patterned photoresist layer of the photolithographic process. Two separate photolithographic/etch processes may be used to form openings 155 and 160 separately. Suitable etch processes include sputter etching, reactive ion etching (RIE) and wet etching.

Figure 1I:
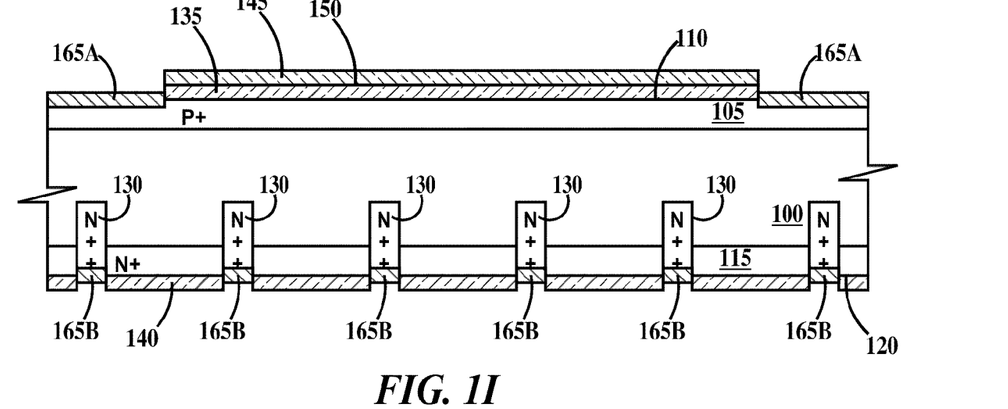

In FIG. 1I, electrically conductive top metal silicide contacts 165A are formed in P-doped layer where the P-doped layer is not protected by top passivation layer 135 and bottom metal silicide contacts 165B are formed in emitters 130 (or regions of N-doped layer 115 if optional emitters 130 were not formed) where the N-doped layer is not protected by bottom passivation layer 140. Metal silicide contacts 165A and 165B may be formed by blanket deposition of metal layers over top and bottom surfaces 105 and 110 of substrate 100, heating the substrate to about 450° C. or higher to react the metal with silicon forming a metal silicide, and then etching to remove unreacted metal. In one example, metal silicide contacts 165A and 165B comprise palladium silicide or nickel silicide.

Figure 1J:
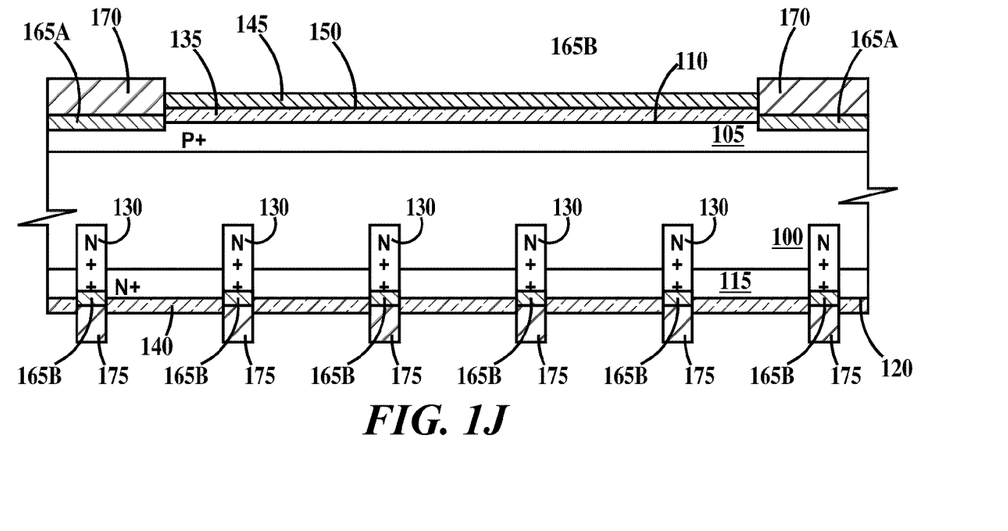

In FIG. 1J, an electrically conductive contact frame 170 is formed. Contract frame 170 contacts the entire exposed surface in FIG. 1I of metal silicide contacts 165A. Also an electrically conductive bus bar 175 is formed. Bus bar 175 contacts bottom the entire exposed surface in FIG. 1I of metal silicide contacts 165B. In one example, frame 170 and bus-bar 175 are formed by electrolytic or electroless plating. In electrolytic plating, a thin metal seed layer is blanket deposited, a patterned photoresist layer formed on the seed layer and photoresist layer, metal plated onto the seed layer, the photoresist layer removed and any seed layer not protected by plated metal removed in a flash etch. In one example, the seed deposition process are performed in two separate depositions. The patterned photoresist layers are formed in separate photolithographic processes. In one example, a single plating step may also be used to form both contact frame 170 and bus bar 175.

Alternatively, conventional subtractive etch or damascene wire processes may be used to form contact frame 170 and bus bar 175 in two separate operations. A damascene process is one in which wire trenches or via openings are formed in a dielectric layer, an electrical conductor of sufficient thickness to fill the trenches is deposited on a top surface of the dielectric, and a CMP process is performed to remove excess conductor and make the surface of the conductor co-planar with the surface of the dielectric layer to form damascene wires. In the case of damascene processes, antireflective layer 145 and bottom passivation layer 140 act as polish stops.

Figure 2A:
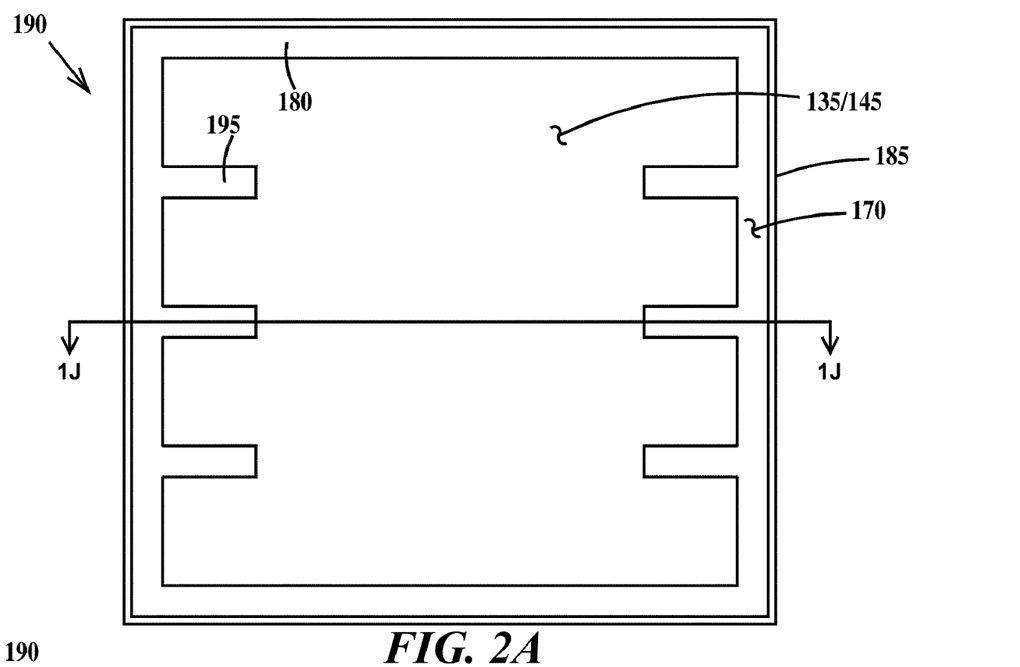
FIG. 2A is a top view of the solar cell of FIG. 1J.

FIG. 2A is a top view of the solar cell of FIG. 1J. In FIG. 2A, line 1J-1J indicates the section FIGS. 1A through 1J are illustrations of. In FIG. 2A, contact frame 170 includes a perimeter region 180 proximate to a perimeter 185 of a solar cell chip 190. Contact frame 170 includes integral contact fingers to P-doped region 105 (see FIG. 1J) in openings in top passivation layer 135 antireflective coating 145. Metal silicide contacts 165A (see FIG. 1J) are covered by contact frame 170 which may overlap the perimeter of contacts 165A.

Figure 2B:
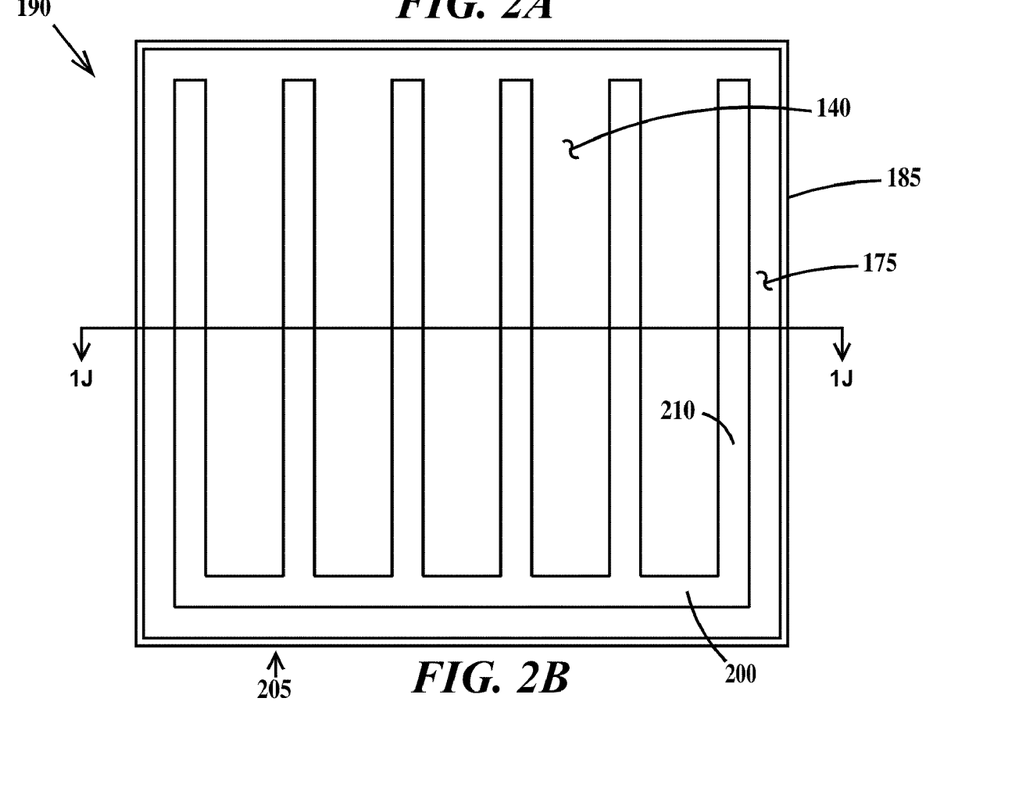
FIG. 2B is a bottom view of the solar cell of FIG. 1J illustrating a first bus bar geometry and FIG. 2C is an bottom view of the solar cell of FIG. 1J illustrating a second bus bar geometry.
Figure 2C:
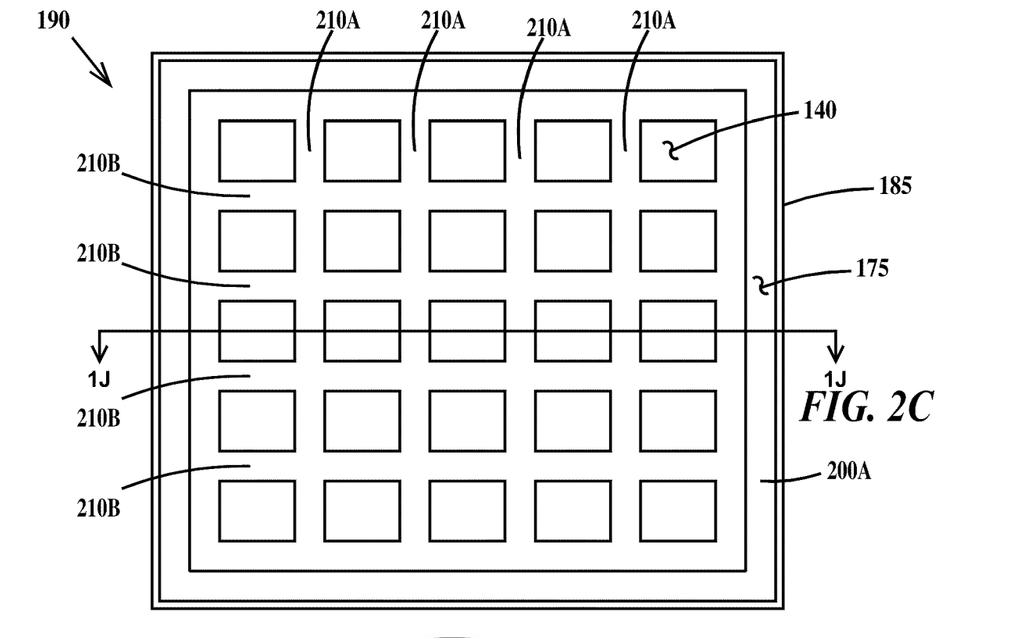

FIG. 2B is a bottom view of the solar cell of FIG. 1J illustrating a first bus bar geometry and FIG. 2C is an bottom view of the solar cell of FIG. 1J illustrating a second bus bar geometry. In FIGS. 2B and 2C, line 1J-1J indicates the section FIGS. 1A through 1J are illustrations of. In FIG. 2B, bus bar 175 includes a bus region 200 proximate an edge 205 of a solar cell chip 190. Bus bar 175 includes integral fingers 210 to emitters 130 (see FIG. 1J) in openings in bottom passivation layer 140. Metal silicide contacts 165B (see FIG. 1J) are covered by bus bar 175 which may overlap the perimeter of contacts 165A. In FIG. 2C, a contact frame 170A comprises a grid of intersecting orthogonal wires 210A and 210B intersecting an optional frame 200A. The structure of FIG. 2C is particularly useful if optional emitters 130 (see FIG. 1F) are not used. Also, if optional emitters 130 (see FIG. 1F) are not used, bus bar 175 may be in the form of an electrically conductive layer or plate that also serves as a backside mirror.

Figure 3:
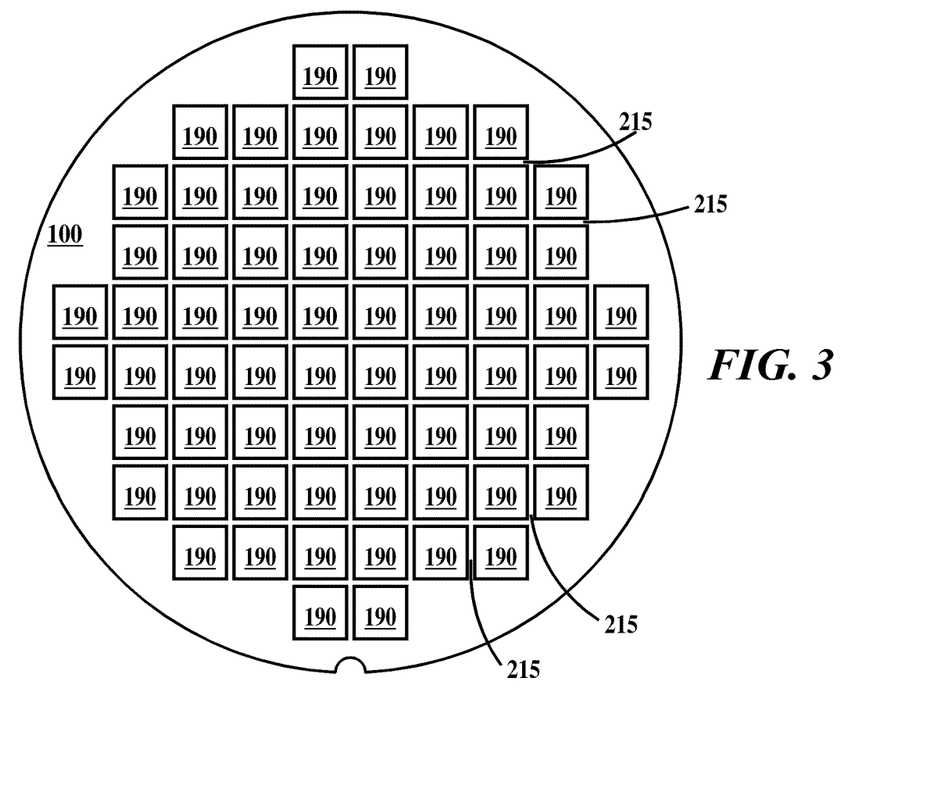
FIG. 3 is a top view of a typical semiconductor substrate having an array of un-singulated solar cell chips fabricated according to the methods illustrated in FIGS. 1A through 1I.

FIG. 3 is a top view of a typical semiconductor substrate having an array of un-singulated solar cells fabricated according to the methods illustrated in FIGS. 1A through 1J. In FIG. 3, an array of solar cell chips 190 are separated by kerfs or streets 215 on substrate 100. Kerfs 215 allow separation or singulation of individual solar cell chips 190. Methods of singulation include mechanical dicing or sawing and laser dicing. Each solar cell chip 190 can range in surface area from about 25 mm$^2$ to about 400 mm$^2$. Though all solar cell chips 190 in FIG. 3 are illustrated as having the same geometric shape (i.e., width and length), solar cell chips having different geometric shapes and thus different surface areas may be fabricated together on the same substrate.

Figure 4:
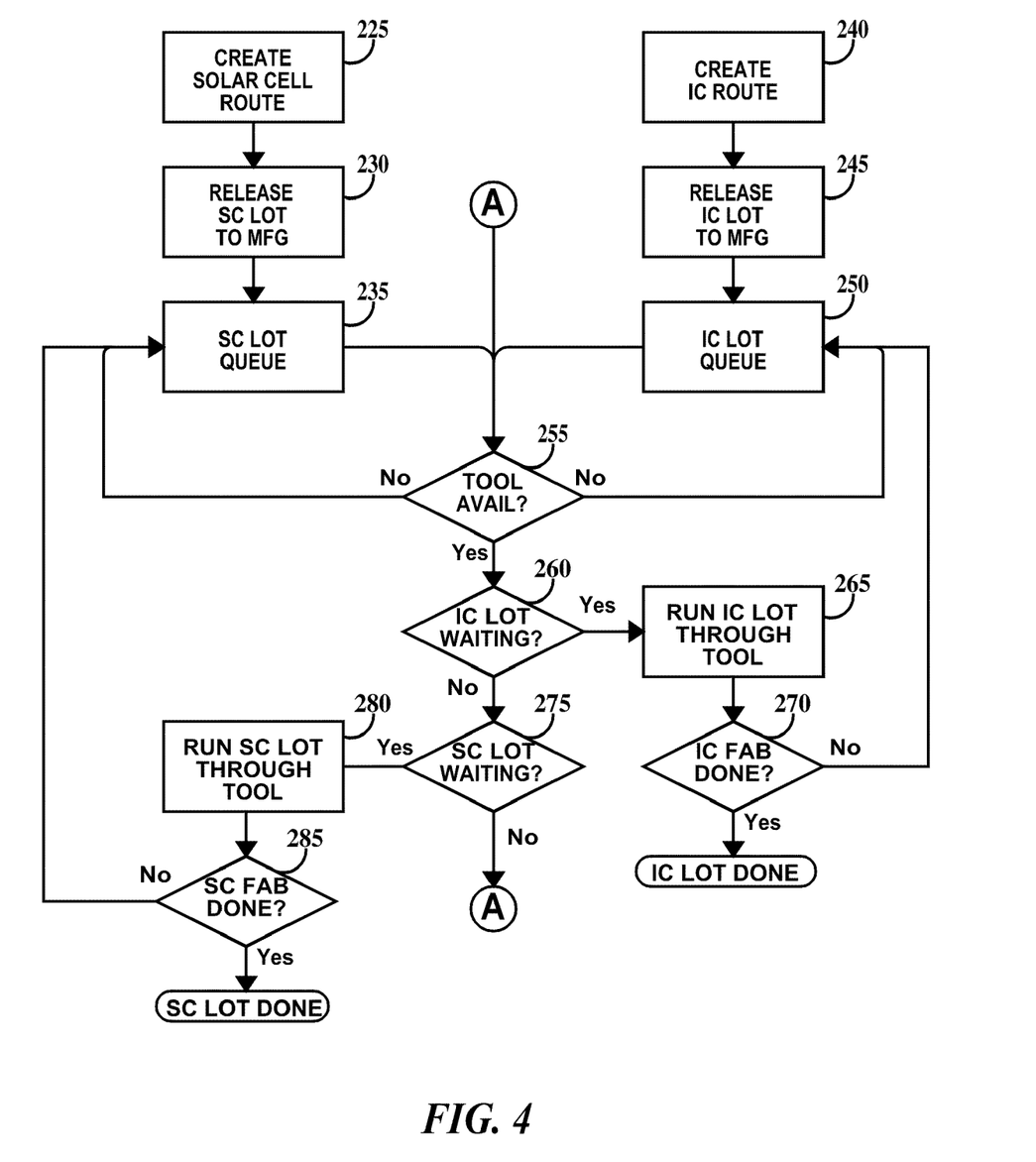
FIG. 4 is flowchart illustrating integration of solar cell chip fabrication into a semiconductor fabrication facility that also fabricates conventional integrated circuit chips.

FIG. 4 is flowchart illustrating integration of solar cell chip fabrication into a semiconductor fabricator that also fabricates conventional integrated circuit chips. A process route is a list of processes or fabrication steps a lot of wafers must be processed through in order to fabricate a solar cell or integrated circuit chip. The process route includes, specific tools (or tool types if there is more than one of kind tooling), tool parameter setting (e.g., time, temperature, gas flow. etc) and photolithographic masks. A lot may be a single wafer or more than one wafer. The process route includes the type of substrate to be used. The process route may include a statement of priority in case more than one lot of wafers is waiting in the same queue. For solar cell fabrication, the substrate may be a reclaimed scrap wafer as discussed supra.

In step 225 a solar cell process route is created. This route may include tools used only for conventional integrated circuit (IC) fabrication or a combination of tools used for IC fabrication and tools used only for solar cell (SC) fabrication. In step 230, a lot of solar cell wafers for solar cell manufacture is released to the manufacturing facility. In step 235 the solar cell lot is placed in a tool queue. Generally there is a queue for each tool or group of tools that can perform the process indicated by the route.

In step 240 an integrated circuit chip process route is created. In step 245, a lot of integrated circuit chip wafers for integrated circuit chip manufacture is released to the manufacturing facility. In step 250 the integrated circuit chip lot is placed in a tool queue. The solar cell lot queue of step 235 and the integrated circuit chip queue of step 250 may be the same queue.

From steps 235 and 250 the method proceeds to step 255 where it is determined if the tool for the particular queue has become available. If the tool is not available the method loops back to steps 235 or 250. If in step 255 a tool becomes available, then in step 260 it is determined if an integrated circuit chip lot is waiting for that tool. If there is an integrated circuit chip lot waiting to be processed through the tool, then in step 265, the integrated circuit chip lot is processed through the tool and in step 270 is determined if integrated chip fabrication for that lot is complete. If not, the method loops to step 250 where the integrated circuit chip lot is placed in the queue for the next processing tool on its route.

Returning to step 260, If there is no integrated circuit chip lot waiting, then in step 275, it is determined if a solar cell lot is waiting to be processed through tool. If so, then in step 280 the solar cell lot is processed through the tool and in step 285 is determined if solar cell fabrication for that lot is complete. If not, the method loops to step 235 where the solar cell lot is placed in the queue for the next processing tool on its route.

Returning to step 275, if there is no solar cell lot waiting then the method loops through connector A to step 255. One feature of the flowchart of FIG. 4, is no solar cell lot is run on any tool if there is an integrated circuit chip lot waiting for that tool, so solar cell lots are only run using the excess capacity of the tool (or tool set when there are multiple tools of the same kind.) An adjustment can be made to step 260 to check (if there is an integrated circuit chip lot waiting) if a solar cell lot has been waiting for longer than a target amount of time, in which case the method would go to step 275 instead of 265 even if there is an integrated circuit chip lot waiting for the tool.

Thus the embodiments of the present invention have migrated the costs of fabricating solar cells by using combinations of conventional semiconductor processes, integrating solar cell fabrication into conventional integrated circuit chip fabrication facilities and utilizing scrap integrated circuit chip wafers.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
  (a) forming a P-doped layer and an N-doped layer in a silicon substrate, said P-doped layer adjacent to a top surface of said substrate and said N-doped layer adjacent to a bottom surface of said substrate;
  (b) forming a dielectric top passivation layer on said top surface of said substrate and a dielectric bottom passivation layer on said top surface of said substrate;
  (c) forming an antireflective coating on said top passivation layer;
  (d) photolithographically forming a first set of openings through said antireflective coating and through said top passivation layer to said P-doped layer and photolithographically forming a second set of openings through said bottom passivation layer to said N-doped layer;
  (e) forming first metal silicide contacts to said P-doped layer and second metal silicide contacts to said N-doped layer in said first and second openings respectively;
  (f) forming metal contact frames on said first metal silicide contacts and metal bus bars on said second metal silicide contacts; and
  (g) singulating said substrate into a plurality of solar cell chips, each solar cell chip including a contact frame and a bus bar.

2. The method of claim 1, wherein (a) includes:
  ion implanting a P-type species into said top surface of said substrate to form said P-doped layer; and
  ion implanting an N-type species into said bottom surface of said substrate to form said N-doped layer.

3. The method of claim 1, wherein (a) includes:
  forming a P-doped glass layer on said top surface of said substrate, thermally diffusing P-type dopant from said P-doped glass layer into said substrate to form said P-doped layer, and removing said P-doped glass layer; and
  forming an N-doped glass layer on said top surface of said substrate, thermally diffusing N-type dopant from said N-doped glass layer into said substrate to form said N-doped layer, and removing said N-doped glass layer.

4. The method of claim 1, wherein (a) includes:
  forming said P-doped layer by gaseous diffusion of an N-dopant gas into said substrate in a furnace; and
  forming said P-doped layer by gaseous diffusion of an N-dopant gas into said substrate in a furnace.

5. The method of claim 1, wherein (f) includes:
  forming a first seed layer over said top surface of said substrate, forming a first patterned photoresist layer on said first seed layer, plating a first metal layer onto said first seed layer where said first seed layer is not covered by said first photoresist layer, removing said first photoresist layer, and removing said first seed layer where said first seed layer is not covered by said first metal layer; and forming a second seed layer over said bottom surface of said substrate, forming a second patterned photoresist layer on said second seed layer, plating a second metal layer onto said second seed layer where said second seed layer is not covered by said second photoresist layer, removing said second photoresist layer, and removing said second seed layer where said second seed layer is not covered by said second metal layer.

6. The method of claim 1, wherein (f) includes:
electroless plating a first metal layer onto said first metal silicide contacts and a second metal layer onto said second metal silicide contacts.

7. The method of claim 1, wherein (f) includes:
depositing a first metal layer over said top surface of said substrate, performing a first chemical-mechanical-polish to remove said first metal layer from over said anti-reflective coating, said first metal layer remaining in said first openings; and
depositing a second metal layer over said bottom surface of said substrate, performing a second chemical-mechanical-polish to remove said metal layer from over said bottom passivation layer, said second metal layer remaining in said second openings.

8. The method of claim 1, furthering including:
before (a) thinning said substrate at least mechanically.

9. The method of claim 1, furthering including:
before (a) reclaiming a scrap substrate from an integrated circuit manufacturing facility and thinning said scrap substrate chemically and mechanically to form said silicon substrate.

10. The method of claim 1, further including between (d) and (e):
forming a patterned masking layer on said bottom surface of said substrate;
ion implanting an additional N-type species into said bottom surface of said substrate where said substrate is not protected by said patterned layer to form emitter regions in said substrate, said emitter regions extending from said bottom surface of substrate through said N-doped layer into said substrate a further distance than said N-doped layer extends into said substrate, a concentration of N-dopant of said emitters greater than a N-dopant concentration of said N-doped layer.

11. The method of claim 1, further including between (d) and (e):
forming a patterned masking layer on said bottom surface of said substrate; forming an N-doped glass layer on said top surface of said substrate, thermally diffusing N-type dopant from said N-doped glass layer into said substrate, and removing said N-doped glass layer to form emitter regions in said substrate, said emitter regions extending from said bottom surface of substrate through said N-doped layer into said substrate a further distance than said N-doped layer extends into said substrate, a concentration of N-dopant of said emitters greater than a N-dopant concentration of said N-doped layer.

* * * * *